(12) United States Patent
Kühne

(10) Patent No.: US 12,358,090 B2
(45) Date of Patent: Jul. 15, 2025

(54) LIFTING DEVICE FOR LOWERING A SUBSTRATE

(71) Applicant: VAT Holding AG, Haag (CH)

(72) Inventor: Clemens Kühne, Valens (CH)

(73) Assignee: VAT Holding AG, Haag (CH)

( * ) Notice: Subject to any disclaimer, the term of this patent is extended or adjusted under 35 U.S.C. 154(b) by 359 days.

(21) Appl. No.: 18/165,440

(22) Filed: Feb. 7, 2023

(65) Prior Publication Data

US 2023/0249304 A1 Aug. 10, 2023

(30) Foreign Application Priority Data

Feb. 7, 2022 (DE) .......................... 102022102742.2

(51) Int. Cl.
 *B23Q 7/00* (2006.01)
(52) U.S. Cl.
 CPC .................................. *B23Q 7/005* (2013.01)
(58) Field of Classification Search
 CPC .......... B23Q 7/00; B23Q 7/005; B23Q 7/006; B23Q 7/1463; H01L 21/68742; H01L 21/68785
 See application file for complete search history.

(56) References Cited

U.S. PATENT DOCUMENTS

| 4,846,623 | A  | * | 7/1989  | Otani ................... B28D 5/0082 |
|           |    |   |         | 414/935                              |
| 11,183,418 | B2 |   | 11/2021 | Forderhase                           |
| 2022/0199456 | A1 | * | 6/2022  | Shindo .............. H01L 21/67742 |
| 2022/0336258 | A1 | * | 10/2022 | Srivastava ........ H01L 21/68742   |
| 2023/0197495 | A1 | * | 6/2023  | Carducci ............. H01L 21/6833 |
|           |    |   |         | 156/345.51                          |
| 2023/0249304 | A1 | * | 8/2023  | Kuhne .............. H01L 21/68785 |
|           |    |   |         | 269/54.5                            |
| 2024/0178047 | A1 | * | 5/2024  | Kim .................. H01L 21/67259 |

FOREIGN PATENT DOCUMENTS

DE          69535114        2/2007

* cited by examiner

Primary Examiner — Lee D Wilson
(74) Attorney, Agent, or Firm — Volpe Koenig

(57) ABSTRACT

A lifting device for lowering a substrate onto and for lifting it off from a substrate carrier in a process chamber. The lifting device had a lifting rod and a linear drive, for moving the lifting rod along a linear lifting movement path, and a plurality of adjustment screws for adjusting the position of the lifting movement path. The lifting device has a drive housing for the linear drive, and a drive housing flange and a passage opening surrounded by this flange. The lifting rod is guided through the passage opening, and the adjustment screws are each screwed through an adjustment screw receiving opening in the drive housing flange. The adjustment screw receiving openings are spaced apart in the drive housing flange, and a protrusion of the respective adjustment screw over the drive housing flange is adjustable by screwing that adjustment screw through the respective receiving opening at differing depths.

13 Claims, 6 Drawing Sheets

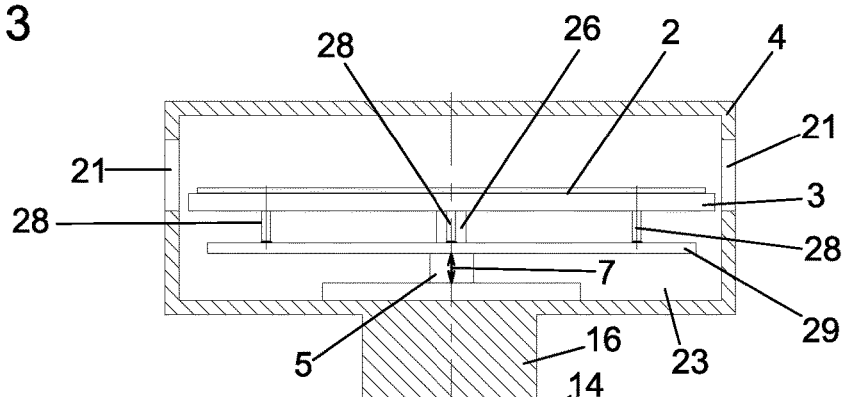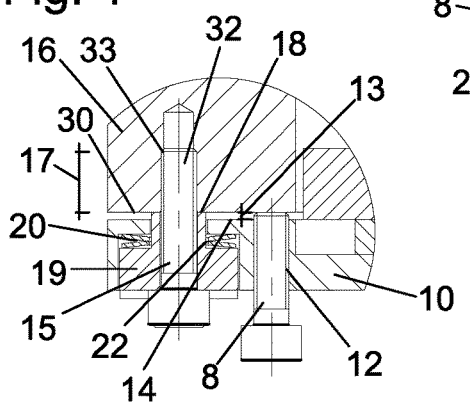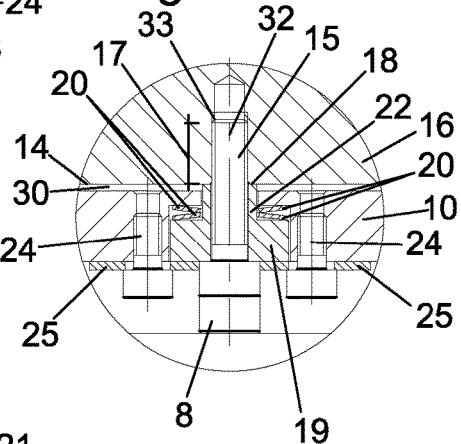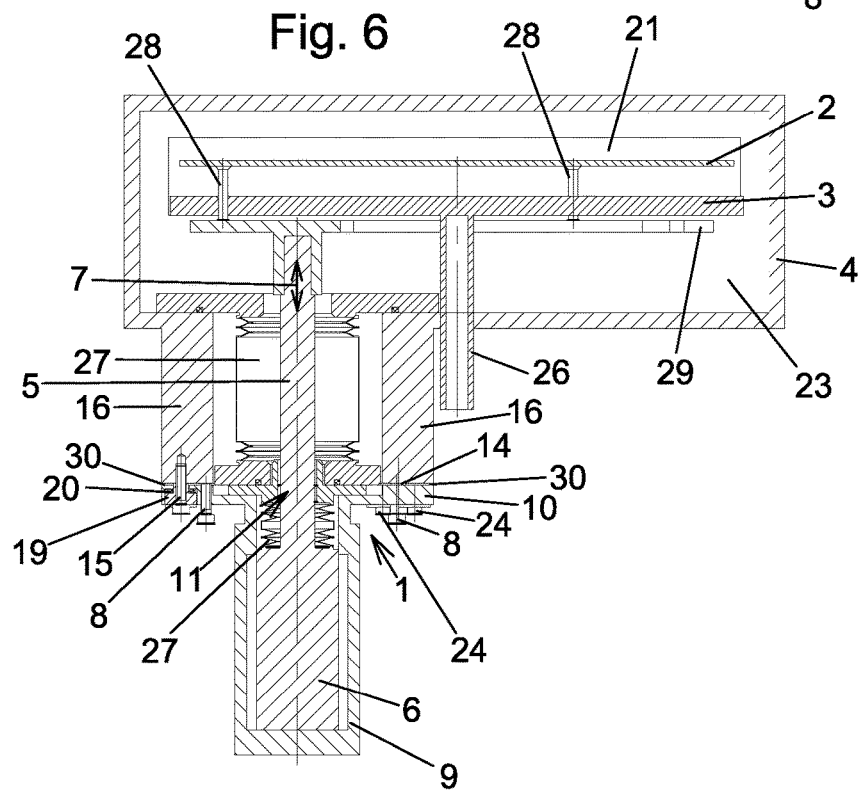

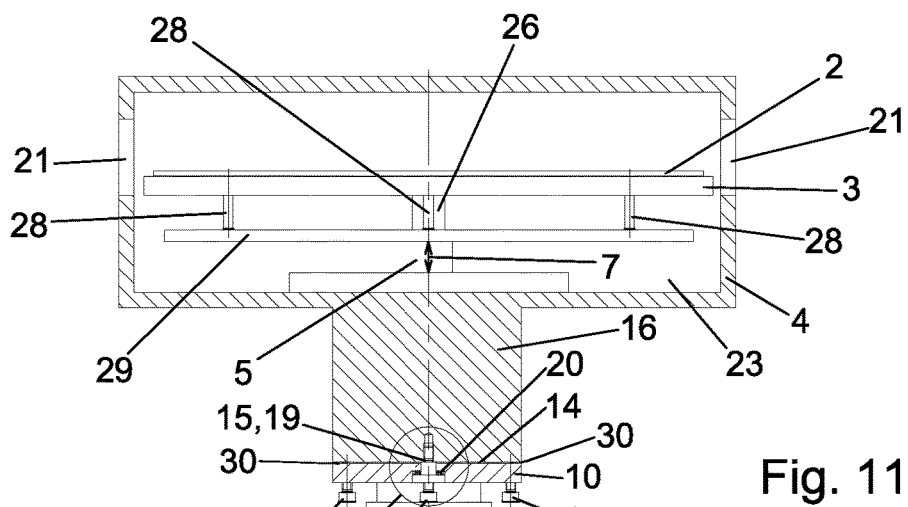
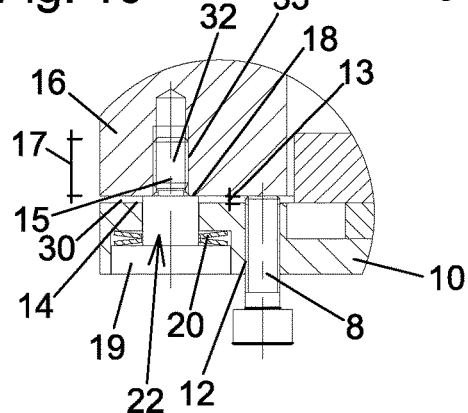
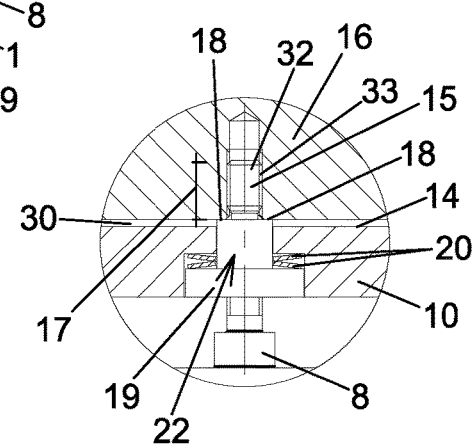
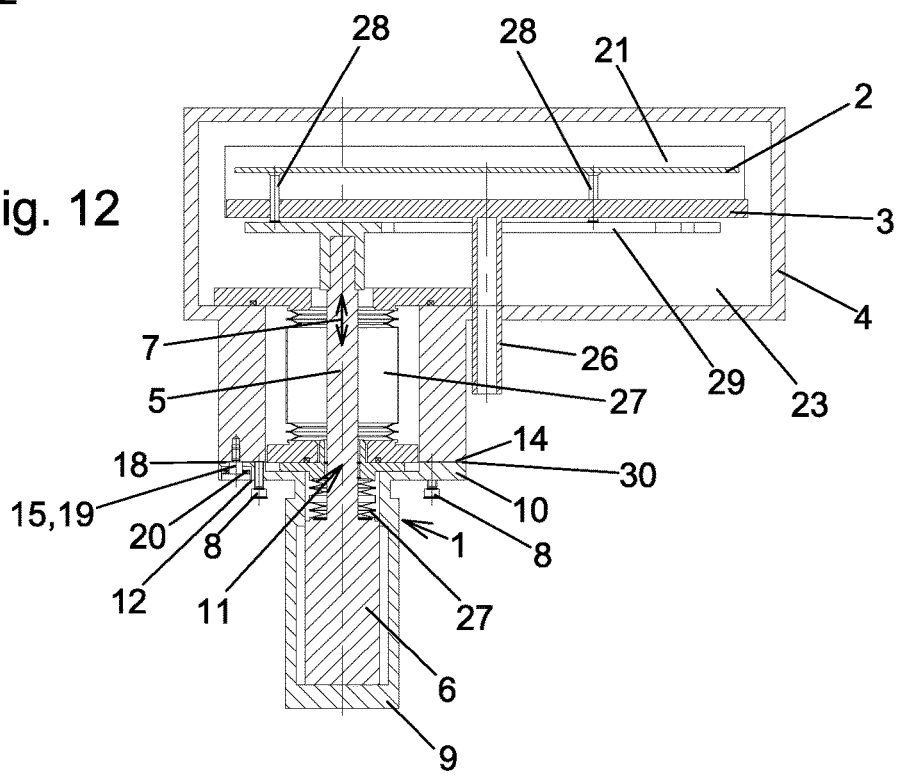

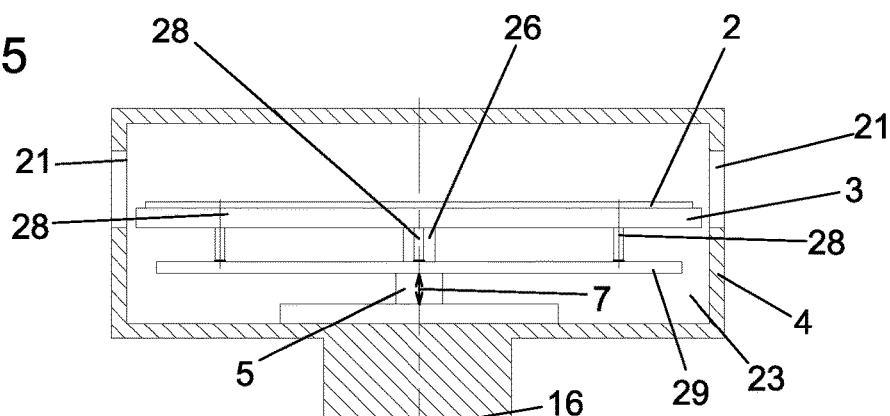
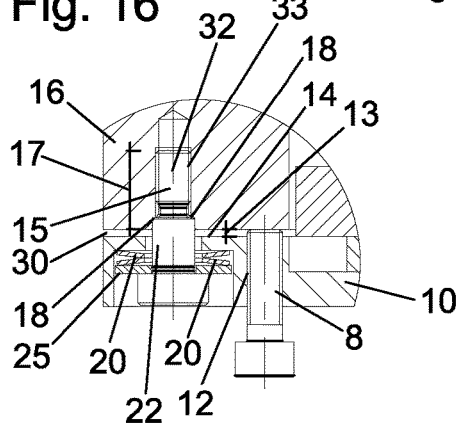
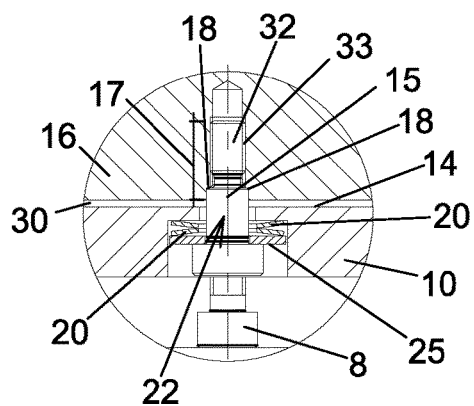
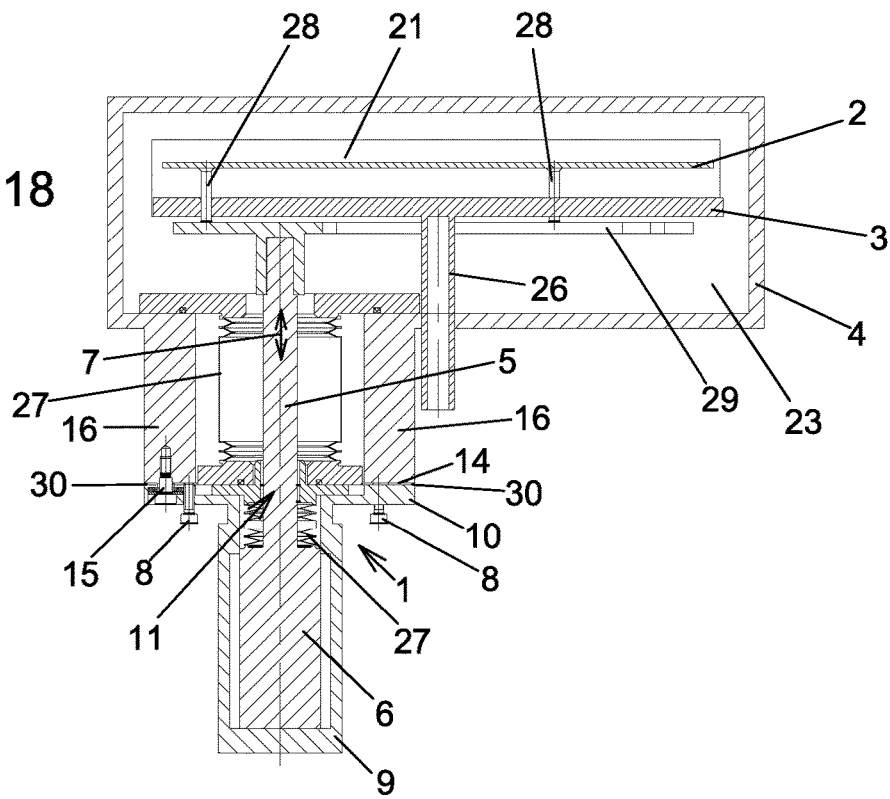

LIFTING DEVICE FOR LOWERING A SUBSTRATE

CROSS-REFERENCE TO RELATED APPLICATIONS

This application claims priority from German Patent Application No. 10 2022 102 742.2, filed Feb. 7, 2022, which is incorporated herein by reference as if fully set forth.

TECHNICAL FIELD

A lifting device for lowering a substrate onto a substrate carrier and for lifting off the substrate from the substrate carrier in a process chamber, in particular in a vacuum process chamber, the lifting device having a lifting rod and a lifting rod linear drive, for moving the lifting rod to and fro along a linear lifting movement path, and a plurality of adjustment screws for adjusting the position of the lifting movement path.

BACKGROUND

Lifting devices of this type are used in process chambers to lower substrates, e.g. wafers and the like, onto a substrate carrier, or to lift them off from the latter. In order to be able to carry out these movements, the lifting rod is moved to and fro along a linear lifting movement path by the lifting rod linear drive. As a rule, the position of the lifting rod or the position of the linear lifting movement path has to be able to be adjusted very precisely.

U.S. Pat. No. 11,183,418 B2 discloses prior art of the type in question. In this document, the lifting rod linear drive is fastened to a multi-part supporting body. In order to adjust the position of the lifting movement path, grooves by means of which a type of bending hinge is realized in each case are formed in said multi-part supporting body. This document also discloses adjustment screws which act on the various subregions of the supporting body and, in interaction with the grooves or the bending hinges formed therefrom, enable the position of the lifting rod or of the linear lifting movement path to be adjusted.

The disadvantage of U.S. Pat. No. 11,183,418 B2 consists in that the multi-part supporting body and the grooves arranged therein are of relatively complicated design.

SUMMARY

It is the object of the invention to provide an alternative possibility of being able to adjust the position of the lifting movement path in lifting devices of the type in question.

This is achieved according to the invention by a lifting device having one or more of the features disclosed herein.

It is therefore provided according to the invention that the lifting device has a drive housing for the lifting rod linear drive, and a drive housing flange and a passage opening surrounded by the drive housing flange, wherein the lifting rod is guided through the passage opening, and the adjustment screws are each screwed through an adjustment screw receiving opening in the drive housing flange, wherein the adjustment screw receiving openings are arranged spaced apart from one another in the drive housing flange, and a protrusion of the respective adjustment screw over the drive housing flange on a mounting side of the drive housing flange opposite the drive housing is adjustable by screwing the respective adjustment screw through the respective adjustment screw receiving opening at differing depths.

The adjustment screws are therefore screwed through corresponding adjustment screw receiving openings in the drive housing flange. Depending on how far the respective adjustment screw is screwed through the adjustment screw receiving opening in the drive housing flange, a protrusion of the adjustment screw remains on the mounting side of the drive housing flange. By adjustment of said protrusions by appropriate rotation of the adjustment screws, the lifting rod guided through the drive housing flange through the corresponding passage opening can be very precisely adjusted in its position and thus so too can the position of the lifting movement path. The ends of the adjustment screws protruding over the drive housing flange on the mounting side can be supported here, for example, on a chamber flange. A gap is advantageously formed between the chamber flange and the drive housing flange, with the gap thickness in the region of the respective adjustment screw simply being able to be adjusted in each case by the respective adjustment screw.

In addition to the lifting device per se, the invention also relates to an arrangement having a process chamber which has a chamber flange, and wherein the arrangement additionally has a lifting device according to the invention, wherein the lifting device is fastened by the drive housing flange to the chamber flange, and the lifting rod reaches into a chamber interior of the process chamber and the position of the lifting movement path of the lifting rod is adjustable by adjusting the respective protrusion of the adjustment screws over the drive housing flange on the mounting side of the drive housing flange opposite the drive housing.

Even if this is not absolutely necessary, it is nevertheless advantageously provided that the mounting side of the drive housing flange opposite the drive housing is designed as a flat surface.

As indicated at the beginning, the substrate can be lowered by the lifting device both onto the substrate carrier, or, in other words, deposited thereon, and also can be lifted off from it. The lifting device is therefore actually, strictly speaking, a lifting and lowering device. For the sake of linguistic simplification, however, the discussion here is only about a lifting device.

Preferably, in the drive housing flange, precisely three adjustment screws are screwed through one of the adjustment screw receiving openings each. The ends of the three adjustment screws or the protrusions of the three adjustment screws on the mounting side of the drive housing flange can thus unambiguously specify a plane, and this complies with an unambiguous adjustment of the linear lifting movement path of the lifting rod.

In order to make possible as fine an adjustment as possible during the adjustment, the adjustment screws advantageously have a fine pitch thread. In particular, in this connection, it is preferably provided that the adjustment screws each have a thread pitch in the range of 0.25 mm per revolution to 0.6 mm per revolution, preferably of 0.3 mm per revolution to 0.5 mm per revolution.

In order to be able to fasten the drive housing flange to the chamber flange, preferred variants of the lifting device make provision that the lifting device has, in addition to the adjustment screws, a plurality of connecting screws, which are each guided through the drive housing flange, for fastening the drive housing flange to a chamber flange of the process chamber. The connecting screws are advantageously also arranged at a distance from one another in the drive housing flange.

Preferred variants make provision that the lifting device has a stop for each of the connecting screws, for specifying a screwing-in depth of the respective connecting screw into the chamber flange. The stop makes it possible to fasten the drive housing flange to the chamber flange in such a manner that a gap remains between the drive housing flange and the chamber flange. The position of the stop makes it possible to specify a maximum gap width in the region of the respective connecting screw. The actual gap width can then be adjusted by means of the adjustment screws.

There are various possibilities for the formation of the stop on the respective connecting screw. Thus, the respective stop can be formed on the respective connecting screw itself. Alternatively, however, the respective stop can in each case also be formed on a bushing, wherein the respective connecting screw is guided through the respective bushing.

Preferred variants of the invention make provision that the lifting device has a plurality of elastic pretensioning elements for elastically pretensioning the drive housing flange against a or the chamber flange of the process chamber. The elastic pretensioning of the pretensioning elements can be directed here in such a manner that it pretensions the drive housing flange in the direction of the chamber flange, and therefore the adjustment screws can then open and enlarge the gap between the drive housing flange and the chamber flange in the region of the respective adjustment screw counter to the pretensioning of the pretensioning elements by said adjustment screws each being screwed to an appropriate extent through the respective adjustment screw receiving opening in the drive housing flange. If, by appropriate rotation of the adjustment screw, the protrusion over the drive housing flange is reduced on the mounting side, the pretensioning of the pretensioning elements automatically ensures that the gap between the chamber flange and the drive housing flange thereby also becomes smaller in this region. In other words, it can therefore be provided that the elastic pretensioning of the respective elastic pretensioning element is in each case directed counter to an increase in the protrusion of the respective adjustment screw over the drive housing flange on the mounting side opposite the drive housing.

The elastic pretensioning elements can each be of annular design. They can basically be configured differently and can also be composed of different materials. The pretensioning elements are advantageously at least one disk spring or else a pack of disk springs. Of course, however, other elastic bodies, such as helical springs, elastomer bodies or the like are also usable as elastic pretensioning elements. The elastic pretensioning elements can be composed of metal, elastomer or other suitable materials.

Provision can be made that each connecting screw is assigned an elastic pretensioning element. Particularly preferably, provision is made that in each case one of the connecting screws is guided through a connecting screw receiving opening in one of the elastic pretensioning elements each.

The substrate can rest directly on an end of the lifting rod correspondingly opposite the lifting rod linear drive when the substrate is lowered onto the substrate carrier or else when the substrate is lifted off from the substrate carrier. However, at said end of the lifting rod opposite the lifting rod linear drive, it is also possible for a support plate to be arranged that is known per se from the prior art mentioned at the beginning and on which lifting pins guided through the substrate carrier are supported. By lifting the lifting rod along the lifting movement path, the lifting pins, and therefore also the substrate lying on the lifting pins, are then also lifted. The same then applies for the lowering. This is known per se from the prior art mentioned at the beginning and does not need to be explained further. The support plate can also have an opening through which a supporting rod supporting the substrate carrier can be guided, optionally in a longitudinally displaceable manner.

Lifting devices according to the invention are used in particular in conjunction with process chambers or with vacuum process chambers, in the chamber interior of which the substrates to be processed, e.g. wafers, are processed in a special atmosphere and/or at a specific pressure level. Vacuum process chambers are then referred to whenever operating states in the chamber interior with pressures of less than or equal to 0.001 mbar (millibar) or 0.1 Pascal are achieved. However, it is already possible also to refer then to vacuum chambers if they are configured for pressures below normal pressure, i.e. below 1 bar.

BRIEF DESCRIPTION OF THE DRAWINGS

Further features and details of preferred embodiments of the invention will be explained by way of example with reference to three embodiment variants of the invention. In the figures:

FIG. 3 shows a vertical section along the intersecting line B-B from FIG. 1;

FIG. 4 shows the region C from FIG. 2 in enlarged form;

FIG. 5 shows the region D from FIG. 3 in enlarged form;

FIG. 6 shows a section analogous to FIG. 2, but with a lifting rod lifted somewhat further than FIG. 2;

FIGS. 7 to 12 show corresponding illustrations for a second exemplary embodiment according to the invention, FIG. 8 showing the vertical section along the intersecting line E-E in FIG. 7, FIG. 9 the vertical section along the intersecting line F-F in FIG. 7, FIG. 10 the detail G from FIG. 8 in enlarged form, and FIG. 11 the detail H from FIG. 9 in enlarged form, and FIGS. 13 to 18 show corresponding illustrations for a third exemplary embodiment according to the invention, with FIG. 14 in turn showing the vertical section along the intersecting line I-I in FIG. 13, FIG. 15 the vertical section along the intersecting line J-J in FIG. 13, FIG. 16 the region K from FIG. 14 in enlarged form, and FIG. 17 the region L from FIG. 15 in enlarged form.

DETAILED DESCRIPTION

Figure 1:
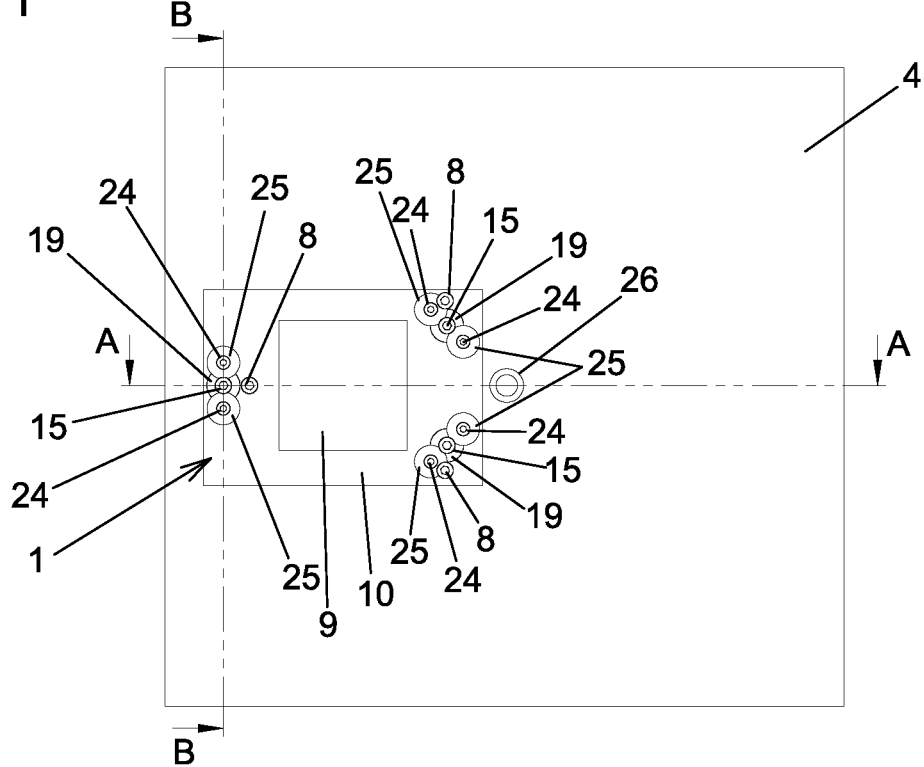
FIG. 1 shows a view from below of a process chamber with a first exemplary embodiment according to the invention of a lifting device.

FIG. 1 shows the first exemplary embodiment of a lifting device 1 according to the invention, which is arranged on the underside of a process chamber 4. In this view from below of the process chamber 4, the drive housing 9 of the lifting device 1 and the underside of the process chamber 4 are seen. Also seen are the drive housing flange 10, the adjustment screws 8 screwed through corresponding adjustment screw receiving openings 12, the connecting screws 15, and also the fastening screws 24 and support washers 25 also explained further below. In addition to the drive housing flange 10, a supporting rod 26 is also seen in this view from below of the process chamber 4. Furthermore, the intersecting lines A-A and B-B are also shown in FIG. 1.

Figure 2:
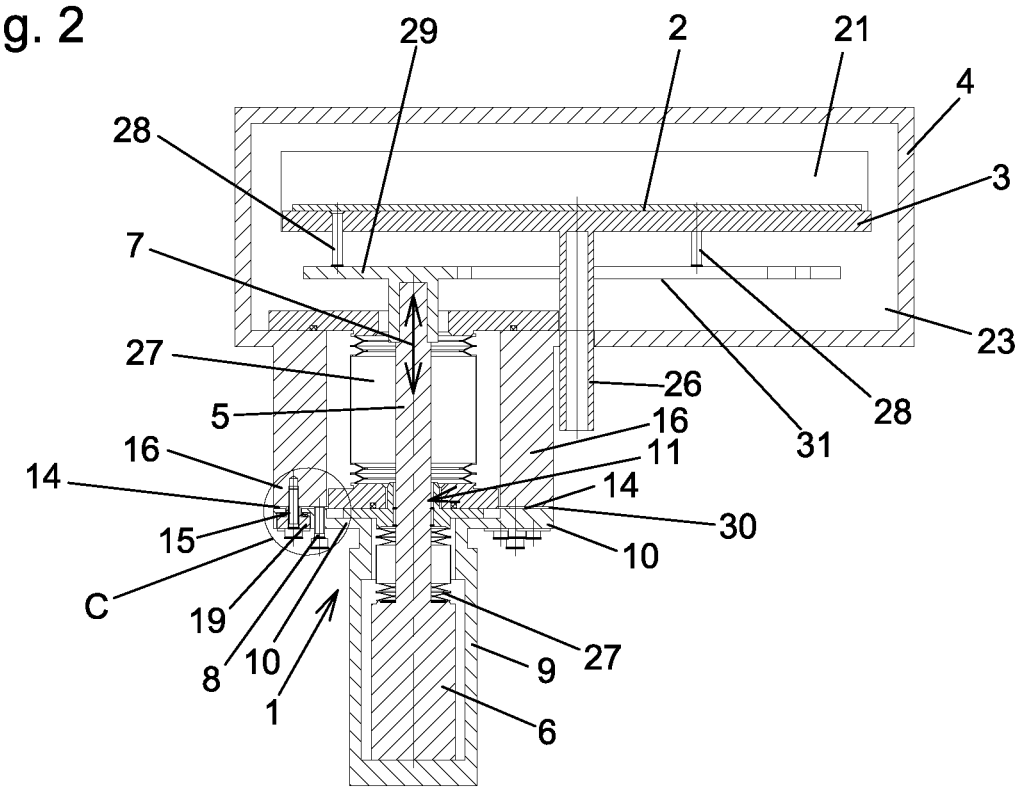
FIG. 2 shows a vertical section along the intersecting line A-A from FIG. 1.

FIG. 2 shows the vertical section along the intersecting line A-A from FIG. 1. It can readily be seen here that the lifting device 1 has a lifting rod linear drive 6, which is not illustrated more precisely here and which can move the lifting rod 5 to and fro along the linear lifting movement path 7. This is advantageously designed in such a manner that the lifting rod 5 can be moved exclusively in the two mutually opposite directions of the lifting movement path 7. The lifting rod linear drive 6 can be designed in a wide variety of embodiments which are known per se. For example, it can be a corresponding pneumatic or hydraulic linear drive. Electrical or else other linear drives which are known per se are just as readily conceivable. In the exemplary embodiment shown, the lifting rod linear drive 6, as also in other preferred embodiments, is at any rate arranged in the drive housing 9 or encased by the latter. In addition to the drive housing 9, the lifting device 1 also has a drive housing flange 10 which surrounds a passage opening 11. The lifting rod 5 is guided through said passage opening 11. The drive housing flange 10, as here in this exemplary embodiment, can be formed integrally on the drive housing 9, but can also be connected in some other way to the drive housing 9. The lifting rod 5 at any rate reaches through the passage opening 11 into the chamber interior 23 of the process chamber 4. Corresponding bellows 27 are provided for sealing the chamber interior 23 against the drive housing 9. For the connection to the drive housing flange 10 of the lifting device 1, the process chamber 4 has the chamber flange 16. The latter in turn surrounds an interior space through which the lifting rod 5 is guided. The mounting side 14 of the drive housing flange 10 faces the chamber flange 16. Between the mounting side 14 of the drive housing flange 10 and the chamber flange 16 there is a gap 30, the gap width of which, as also described in detail further below, can be adjusted by means of the adjustment screws 8. By appropriate screwing in or unscrewing of the adjustment screws 8, the protrusion 13 thereof over the mounting side 14 and of the drive housing flange 10 can be individually adjusted, and therefore a corresponding adjustment of the position of the lifting movement path 7 or alignment of the lifting rod 5 by means of the adjustment screws 8 is possible. How this precisely functions will be explained further below with reference to FIGS. 4 and 5. FIG. 4 shows the region C from FIG. 2 in enlarged form, and FIG. 5 shows the region D from FIG. 3 in enlarged form.

In the exemplary embodiment shown here, at the end of the lifting rod 5 opposite the lifting rod linear drive 6 there is a support plate 29 which, in this exemplary embodiment, annularly surrounds an opening 31. By way of example in this exemplary embodiment, a supporting rod 26, on which the substrate carrier 3 is fastened, is guided through said opening 31. The substrate carrier 3 is located at any rate in the chamber interior 23 of the process chamber 4. The substrate 2 to be processed lies on said substrate carrier during the processing process. In order to introduce the substrate 2 into the chamber interior 23 of the process chamber 4, and also to remove the substrate 2 from the chamber interior 23, the chamber wall of the process chamber 4 has, in a manner known per se, chamber openings 21 which can be closed by valves, which are not illustrated here but which are known per se. The substrate carrier 3, as illustrated here, can be adjustable in height in the vertical direction by means of the supporting rod 26, but can just as readily also be arranged fixedly in the chamber interior 23.

In the exemplary embodiment which is shown, lifting pins 28 are at any rate guided through the substrate carrier 3. The lifting pins 28 are supported on the support plate 29. The support plate 29 can be oriented very precisely by an appropriate adjustment of the lifting rod 5. If the lifting rod 5 is lifted upward along the lifting movement path 7 by the lifting rod linear drive 6, the lifting pins 28 mounted on the support plate 29 are thereby likewise displaced upward and thus lift the substrate 2 lying on the substrate carrier 3. By lowering the lifting rod 5 downward along the lifting movement path 7, the support plate 29 is also lowered. By this means, the lifting pins 28 and the substrate 2 lying thereon are then also correspondingly lowered. In this exemplary embodiment, the lowering and lifting of the substrate 2 on or from the substrate carrier 3 by means of the lifting rod 5 therefore takes place via the support plate 29 and the lifting pins 28. In a departure from this, however, provision can of course also be made that the lifting rod 5 acts, in particular with its end opposite the lifting rod linear drive 6, directly on the substrate 2 in order to lift off the latter from the substrate carrier 3 or to lower the substrate 2 onto the substrate carrier 3. For this purpose, for example, there can be an opening, not illustrated here, in the substrate carrier 3, through which the lifting rod 5 can be correspondingly guided in order to directly reach the substrate 2.

FIG. 3 shows a vertical section through said exemplary embodiment along the intersecting line B-B from FIG. 1. FIG. 6 shows an analogous illustration to FIG. 2 for this exemplary embodiment, wherein, however, the lifting rod 5 is lifted in the vertical direction to such an extent that it has lifted the substrate 2 off from the substrate carrier 3 by means of the support plate 29 and the lifting pins 28. While the processing of the substrate 2 then takes place whenever the latter lies on the substrate carrier 3, as shown in FIG. 2, the substrate 2 in the position shown in FIG. 6 can be gripped, e.g. by a corresponding robot arm or the like and removed through the chamber opening 21 or, conversely, can be moved from the outside through the chamber opening 21 into the chamber interior 23 and deposited on the lifting pins 28. The lowering of the substrate 2 then takes place in turn by a corresponding movement of the lifting rod 5 downward along the lifting movement path 7.

FIG. 4, in which the detail C from FIG. 2 is illustrated in enlarged form, shows one of the adjustment screws 8, as it is screwed through the drive housing flange 10 through a corresponding adjustment screw receiving opening 12. The corresponding threads on the adjustment screw receiving opening 12 and on the adjustment screw 8 are not illustrated specifically, but, as in the prior art, can be designed in a manner known per se. The threads here are conventionally an external thread on the adjustment screw 8 and a corresponding internal thread on the drive housing flange 10 which surrounds the adjustment screw receiving opening 12. By appropriate screwing in and unscrewing of the adjustment screw 8, the protrusion 13 of the respective adjustment screw 8 over the drive housing flange 10 on the mounting side 14 of the drive housing flange 10 opposite the drive housing 9 can be adjusted. The protrusion 13 then in this way also specifies the gap width of the gap 30 in the region of the respective adjustment screw 8. The individual adjustment screws 8 and therefore also the adjustment screw receiving openings 12 are arranged at a distance from one another in the drive housing flange 10, as can readily be seen in FIG. 1. Advantageously, in the drive housing flange 10 there are precisely three adjustment screws 8 which are each screwed through one of the adjustment screw receiving openings 12. As explained at the beginning, the adjustment screws 8 advantageously have a corresponding fine pitch thread, and therefore the size of the protrusion 13 over the mounting side 14 of the drive housing flange 10 can be very precisely adjusted.

In addition to the adjustment screws 8, the lifting device 1 also has a plurality of connecting screws 15. The latter are guided through the drive housing flange 10 and serve for fastening the drive housing flange 10 to the chamber flange 16 of the process chamber 4. For this purpose, the connecting screws 15 are screwed by their threaded pin 32 into corresponding threaded holes 33 in the chamber flange 16. Advantageously, provision is made here that the lifting device 1 has a stop 18 for each of the connecting screws 15, for specifying the screwing-in depth 17 of the respective connecting screw 15 into the chamber flange 16. The connecting screws 15 are therefore each screwed through corresponding openings in the drive housing flange 10 to an extent until they strike with their stop 18 against the chamber flange 16, as a result of which a defined screwing-in depth 17 is specified. In the first exemplary embodiment according to FIGS. 1 to 6, the respective stop 18 is in each case formed on a bushing 19, wherein the respective connecting screw 15 is guided through the respective bushing 19.

The connecting screws 15 are advantageously also guided through the drive housing flange 10 at points at a distance from one another. The exemplary embodiments illustrated here show by way of example that in each case one connecting screw 15 can be arranged in the vicinity of one of the adjustment screws 8 each. However, this does not necessarily have to be the case.

In addition to the adjustment screws 8 and the connecting screws 15, lifting devices 1 according to the invention advantageously also have a plurality of elastic pretensioning elements 20 for elastically pretensioning the drive housing flange 10 against the chamber flange 16 of the process chamber 4. As is also realized here, it is advantageously provided that the pretensioning direction of the elastic pretensioning elements 20 is oriented in such a manner that it pretensions the drive housing flange 10 in the direction of the chamber flange 16. In other words, the pretensioning of the elastic pretensioning elements 20 therefore acts in the direction of reducing the gap width of the gap 30 between the drive housing flange 10 and the chamber flange 16. This also has the effect that the elastic pretensioning of the respective elastic pretensioning element 20 is in each case directed counter to an enlargement of the protrusion 13 of the respective adjustment screw 8 over the drive housing flange 10 on the mounting side opposite the drive housing 9.

The elastic pretensioning elements 20 can differ in design. They may be metal springs, but also other elastic bodies. In preferred embodiments, provision can be made, as here, that the elastic pretensioning elements are each of annular design. For example, as also realized here, the use of disk springs as elastic pretensioning elements 20 is appropriate. They can be individual disk springs or, as in the exemplary embodiment shown here, a disk spring pack. It is particularly preferred if, as also realized here, the connecting screws 15 are guided through a connecting screw receiving opening 22 in one of the elastic pretensioning elements 20 each.

Irrespective of the specific design, it is at any rate advantageously the case that the adjustment screws 8 and the elastic pretensioning elements 20 interact with one another in order to adjust the width of the gap 30 in the respective region of the adjustment screw 8. If the protrusion 13 is enlarged by appropriate screwing in of the respective adjustment screw 8 through the respective adjustment screw receiving opening 12 in the drive housing flange 10, the gap width of the gap 30 is thereby also correspondingly enlarged in this region. The elastic pretensioning elements 20 are compressed here counter to their pretensioning. If, by contrast, by appropriately rotating the respective adjustment screw 8 in the opposite direction, the protrusion 13 of the adjustment screw 8 on the mounting side 14 of the drive housing flange 10 is reduced, the pretensioning of the elastic pretensioning elements 20 ensures that the gap width of the gap 30 is reduced in this region. This makes it possible, by appropriate screwing-in and unscrewing of the adjustment screws 8, and therefore by appropriate adjustment of the protrusions 13 thereof over the mounting side 14 of the drive housing flange 10, to very precisely adjust the position of the drive housing flange 10 relative to the chamber flange 16 and therefore also the position of the lifting movement path 7 or lifting rod 5. By this means, in these exemplary embodiments shown here, the alignment and position of the support plate 29 in the chamber interior 23 is then also very precisely adjusted automatically.

The mounting side 14 of the drive housing flange 10 opposite the drive housing 9 is advantageously designed as a flat surface. This preferably also applies to a corresponding surface of the chamber flange 16 facing the drive housing flange 10. However, neither have to be the case. Both the mounting side 14 and a correspondingly opposite surface of the chamber flange 16 may also be designed differently.

It can readily be seen in FIG. 4 how the two elastic pretensioning elements 20 designed here as disk springs are blocked between the bushing 19 and the drive housing flange 10. As soon as the connecting screws 15 are correspondingly screwed into the threaded holes 33 in the chamber flange 16 as far as the stop 18, the bushing 19 and the elastic pretensioning elements 20 are therefore held captively by the respective connecting screw 15. In order also to avoid losing the bushing 19 and/or the pretensioning elements 20 in the state in which the connecting screws 15 are not yet correspondingly screwed through the drive housing flange 10 into the chamber flange 16, the fastening screws 24, which are shown in particular in FIG. 5 or in the corresponding region D from FIG. 3, are provided in this exemplary embodiment. The heads of said fastening screws, as illustrated in FIG. 5, press the bushing 19 and the elastic pretensioning elements 20 against the drive housing flange 10 using the support washers 25, and therefore, even if the connecting screw 22 is not yet present, the bushing 19 and the pretensioning elements 20 are securely held in their position in the drive housing flange 10. In this first exemplary embodiment, the fastening screws 24 are therefore purely an assembly aid. As soon as the connecting screws 15 are screwed to an appropriate extent through the drive housing flange 10 into the chamber flange 16, as illustrated in FIGS. 4 and 5, the fastening screws 24 and the support washers 25 are actually no longer required. However, they can nevertheless remain in situ since they are not in the way even in this state.

FIGS. 7 to 12 now show a second exemplary embodiment of a lifting device 1 according to the invention on a corresponding chamber 4, in which the fastening screws 24 and the support washers 25 have been omitted. Apart from the differences described below over the first exemplary embodiment, the second exemplary embodiment corresponds to the first exemplary embodiment, and therefore only the differences will be discussed. Otherwise, with regard to the second exemplary embodiment, reference is made to the above description of the first exemplary embodiment.

Figure 7:
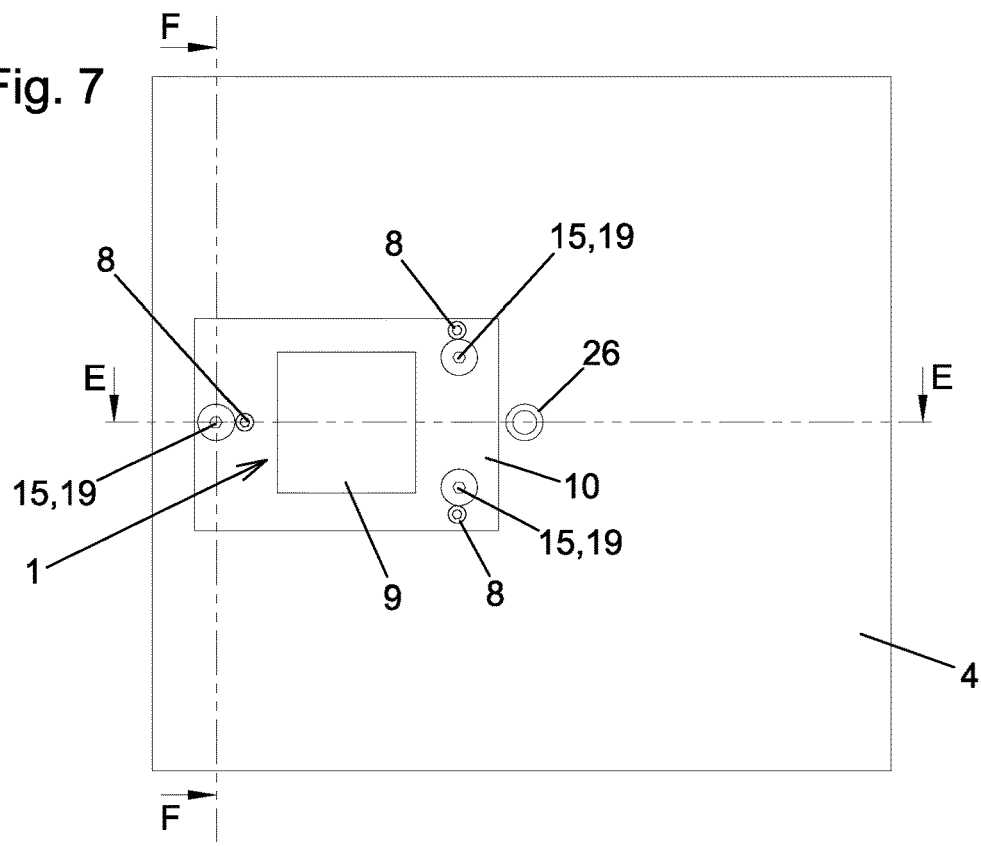
Figure 8:
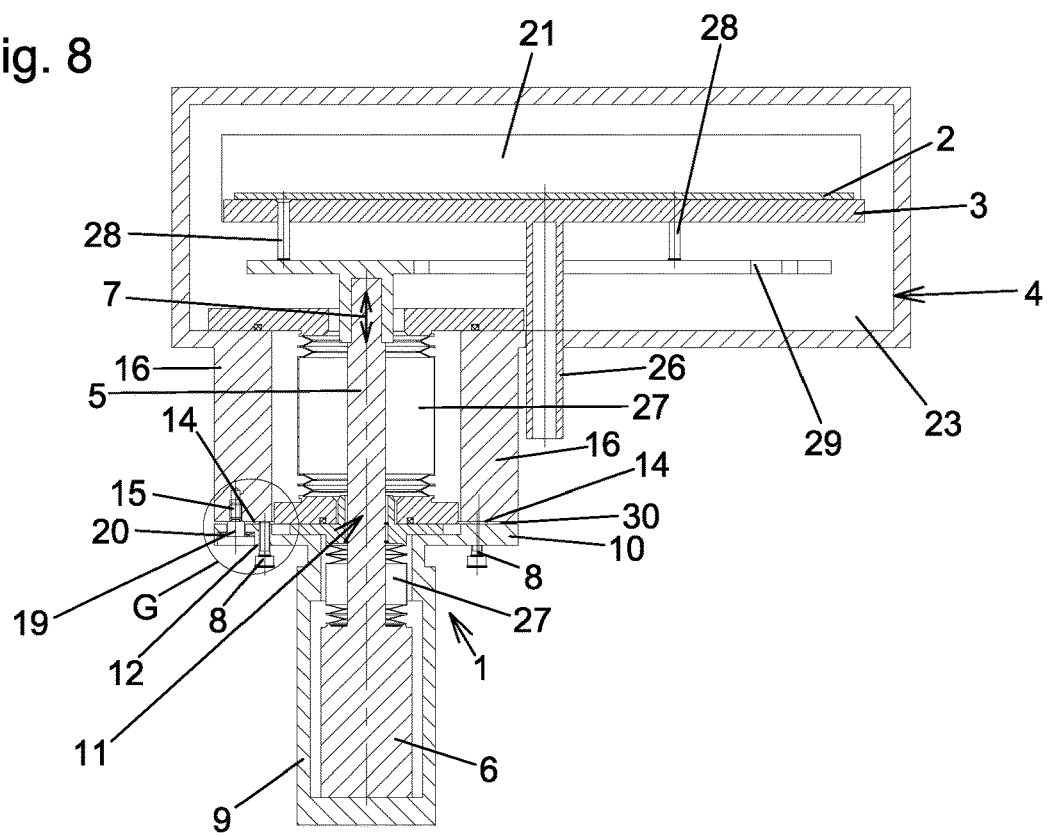
Figure 13:
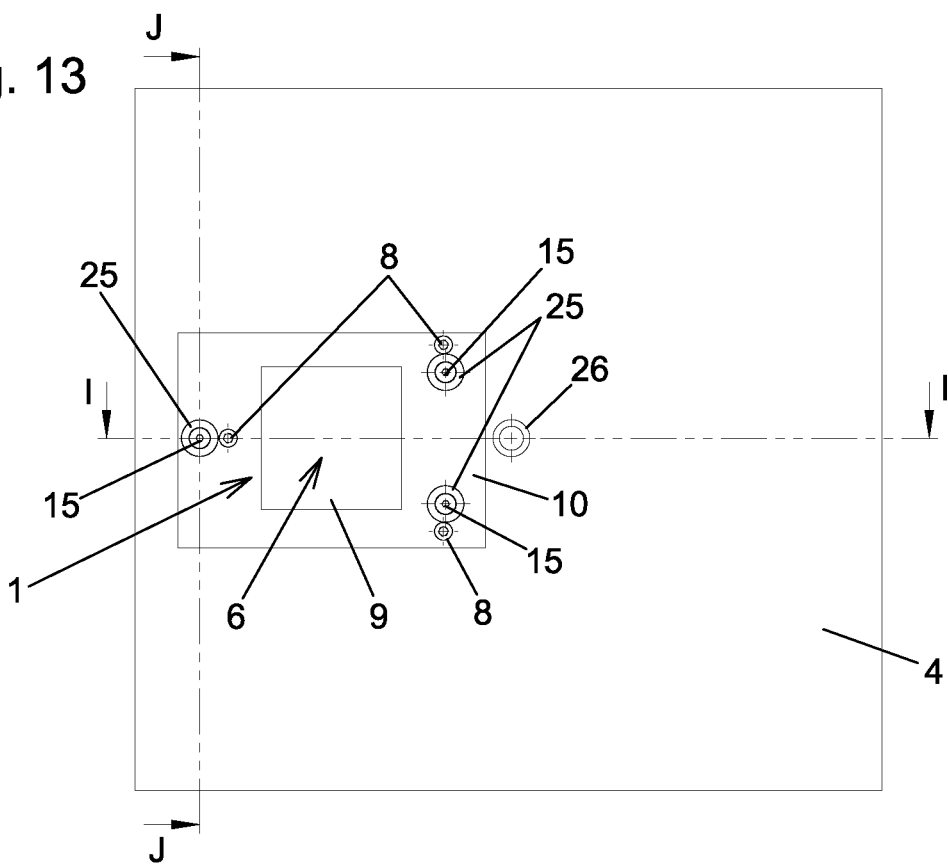

In said second exemplary embodiment, FIG. 7 shows in turn a view from below of the lifting device 1 and the chamber 4. FIGS. 8 and 12 in turn show vertical sections along the intersecting line E-E from FIG. 7, wherein, in FIG.

8, the lifting rod 5 has moved downward along the lifting movement path 7 to an extent such that the substrate 2 rests on the substrate carrier 3. FIG. 12 shows the situation in which, by moving the lifting rod 5 upward to an appropriate extent, the substrate 2 is lifted off from the substrate carrier 3. FIG. 9 shows the vertical section along the intersecting line F-F. FIG. 10 shows the region G from FIG. 8 in an enlarged form. FIG. 11 shows the region H from FIG. 9 in an enlarged form. The difference over the first exemplary embodiment can now also be readily seen in FIGS. 10 and 11. The difference consists in that here, in this variant, the respective bushing 19 is formed integrally with the respective connecting screw 15. The effect achieved by this in this exemplary embodiment is that the respective stop 18 is formed on the respective connecting screw 15 itself. The fastening screws 24 and the support washers 25 are entirely omitted in this exemplary embodiment. Otherwise, this exemplary embodiment and in particular the interaction of the adjustment screws 8 with the elastic pretensioning elements 20 function in the same manner as in the first exemplary embodiment. The adjustment of the position of the lifting movement path 7 also takes place here by appropriate screwing-in and/or unscrewing of the adjustment screws 8, and therefore by appropriate adjustment of the protrusions 13 of the adjustment screws 8 over the mounting side 14 of the drive housing flange 10.

FIGS. 13 to 18 now show a third exemplary embodiment of the invention, wherein the differences over the first two exemplary embodiments can in turn be found in the region of the connecting screws 15. The connecting screws 15 here are designed as what are referred to as shoulder fitting screws. That is to say that the stop 18 of the respective connecting screw 15 is formed by a corresponding shoulder in the shaft region of the connecting screw 15. The remaining shaft of the connecting screw 15 is designed as a threaded pin 32 which in turn is screwed into a corresponding threaded hole 33 in the chamber flange 16. In this way, the stop 18 in turn specifies the screwing-in depth 17 of the connecting screw 15. This can be seen particularly readily in FIGS. 16 and 17. FIG. 16 shows the region K from FIG. 14 in enlarged form, and FIG. 17 shows the region L from FIG. 15 in enlarged form. It can also be readily seen in FIGS. 16 and 17 that here in this exemplary embodiment a bushing 19 is entirely omitted. A support washer 25 which is supported on the head of the respective connecting screw 15 is in each case provided here. The respective pretensioning elements 20 are then blocked between the support washer 25 and the drive housing flange 10.

Figure 14:
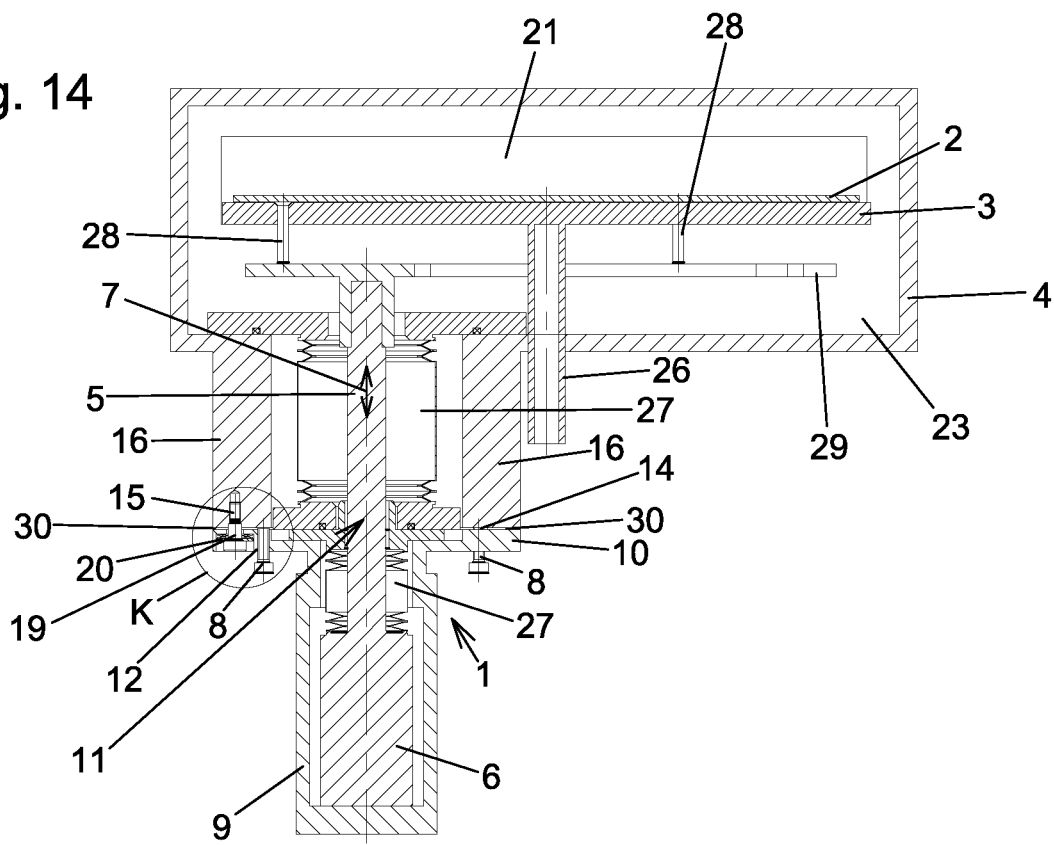

Apart from the differences described, the construction and the manner of operation of this third exemplary embodiment likewise corresponds to the first exemplary embodiment, and therefore reference is also made here otherwise to the above description of this first exemplary embodiment. It is merely emphasized that FIG. 13 in turn shows views from below of the lifting device 1 and the process chamber 4. FIGS. 14 and 18 in turn show vertical sections along the intersecting lines I-I, FIG. 14 with a substrate 2 deposited on the substrate carrier 3 and FIG. 18 with a substrate 2 lifted off from the substrate carrier 3. FIG. 15 shows a vertical section along the intersecting line J-J from FIG. 13.

KEY FOR THE REFERENCE NUMBERS

1. Lifting device
2. Substrate
3. Substrate carrier
4. Process chamber
5. Lifting rod
6. Lifting rod linear drive
7. Lifting movement path
8. Adjustment screw
9. Drive housing
10. Drive housing flange
11. Passage opening
12. Adjustment screw receiving opening
13. Protrusion
14. Mounting side
15. Connecting screw
16. Chamber flange
17. Screwing-in depth
18. Stop
19. Bushing
20. Pretensioning element
21. Chamber opening
22. Connecting screw receiving opening
23. Chamber interior
24. Fastening screw
25. Support washer
26. Supporting rod
27. Bellows
28. Lifting pin
29. Support plate
30. Gap
31. Opening
32. Threaded pin
33. Threaded hole

The invention claimed is:

1. A lifting device for lowering a substrate onto a substrate carrier and for lifting off the substrate from the substrate carrier in a process chamber, the lifting device comprising:
a lifting rod:
a lifting rod linear drive configured to move the lifting rod to and fro along a linear lifting movement path;
a plurality of adjustment screws configured to adjust a position of the lifting movement path;
a drive housing for the lifting rod linear drive, the drive housing including a drive housing flange and a passage opening surrounded by the drive housing flange;
the lifting rod is guided through the passage opening;
the adjustment screws are each screwed through a respective adjustment screw receiving opening in the drive housing flange, and the adjustment screw receiving openings are arranged spaced apart from one another in the drive housing flange; and
a protrusion of the respective adjustment screw over the drive housing flange on a mounting side of the drive housing flange opposite the drive housing is adjustable by screwing the respective adjustment screw through the respective adjustment screw receiving opening to differing depths.

2. The lifting device as claimed in claim 1, wherein there are precisely three adjustment screws in the drive housing flange that are screwed through respective ones of the adjustment screw receiving openings.

3. The lifting device as claimed in claim 1, wherein the adjustment screws each have a thread pitch in a range of 0.25 mm/revolution to 0.6 mm/revolution.

4. The lifting device as claimed in claim 1, further comprising a plurality of connecting screws that are each guided through the drive housing flange, for fastening the drive housing flange to a chamber flange of the process chamber.

5. The lifting device as claimed in claim 4, further comprising a stop for each of the connecting screws configured to specify a screwing-in depth of the respective connecting screw into the chamber flange.

6. The lifting device as claimed in claim 5, wherein the respective stop is formed directly on the respective connecting screw.

7. The lifting device as claimed in claim 5, wherein the respective stop is in each case formed on a respective bushing, and the respective connecting screw is guided through the respective bushing.

8. The lifting device as claimed in claim 1, further comprising a plurality of elastic pretensioning elements configured to elastically pretension the drive housing flange against a chamber flange of the process chamber.

9. The lifting device as claimed in claim 8, wherein the elastic pretensioning of the respective elastic pretensioning element is in each case directed counter to an increase in the protrusion of the respective adjustment screw over the drive housing flange on the mounting side opposite the drive housing.

10. The lifting device as claimed in claim 8, wherein the elastic pretensioning elements are in each case annular.

11. The lifting device (1) as claimed in claim 4, further comprising a plurality of elastic pretensioning elements configured to elastically pretension the drive housing flange against a chamber flange of the process chamber, and in case one of the connecting screws is guided through a connecting screw receiving opening in a respective one of the elastic pretensioning elements.

12. The lifting device as claimed in claim 1, wherein the mounting side of the drive housing flange opposite the drive housing is a flat surface.

13. An arrangement comprising:

a process chamber having a chamber flange; and the lifting device as claimed in claim 1, wherein the lifting device is fastened by the drive housing flange to the chamber flange, and the lifting rod extends into a chamber interior of the process chamber and the position of the lifting movement path of the lifting rod is configured to be adjusted by adjusting the respective protrusion of the respective adjustment screws over the drive housing flange on the mounting side of the drive housing flange opposite the drive housing.

* * * * *